United States Patent
Yuasa et al.

(10) Patent No.: US 7,948,717 B2
(45) Date of Patent: May 24, 2011

(54) MAGNETO-RESISTANCE EFFECT ELEMENT, MAGNETIC HEAD, MAGNETIC RECORDING/REPRODUCING DEVICE AND MAGNETIC MEMORY

(75) Inventors: Hiromi Yuasa, Kawasaki (JP); Hideaki Fukuzawa, Kawasaki (JP); Yoshihiko Fuji, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 928 days.

(21) Appl. No.: 11/898,079

(22) Filed: Sep. 7, 2007

(65) Prior Publication Data
US 2008/0062574 A1  Mar. 13, 2008

(30) Foreign Application Priority Data
Sep. 8, 2006  (JP) ................ P2006-243868

(51) Int. Cl.
*G11B 5/39*  (2006.01)
(52) U.S. Cl. .............. 360/324; 360/313; 360/324.2; 365/171; 428/811
(58) Field of Classification Search ........... 360/313, 360/324–324.2; 365/158, 171, 173; 257/421; 428/811
See application file for complete search history.

(56) References Cited

U.S. PATENT DOCUMENTS

| | | | |
|---|---|---|---|
| 4,258,126 A | 3/1981 | Hiesinger | |
| 5,701,223 A | 12/1997 | Fontana, Jr. et al. | |
| 6,181,537 B1 | 1/2001 | Gill | |
| 6,262,869 B1 | 7/2001 | Lin et al. | |
| 6,348,274 B1 | 2/2002 | Kamiguchi et al. | |
| 6,519,123 B1 | 2/2003 | Sugawara et al. | |
| 6,646,834 B2 | 11/2003 | Sano et al. | |
| 6,667,616 B1 | 12/2003 | Shukh et al. | |
| 6,686,068 B2 * | 2/2004 | Carey et al. | 428/811.3 |
| 6,687,099 B2 | 2/2004 | Nakatani et al. | |
| 6,707,649 B2 | 3/2004 | Hasegawa et al. | |
| 6,710,984 B1 | 3/2004 | Yuasa et al. | |
| 6,710,986 B1 | 3/2004 | Sato et al. | |
| 6,807,034 B2 | 10/2004 | Hasegawa et al. | |
| 6,937,447 B2 | 8/2005 | Okuno et al. | |
| 6,956,765 B2 | 10/2005 | Saito et al. | |
| 6,967,386 B2 | 11/2005 | Mizuguchi | |
| 7,054,119 B2 | 5/2006 | Sharma et al. | |
| 7,123,453 B2 | 10/2006 | Hasegawa et al. | |
| 7,196,877 B2 | 3/2007 | Yoshikawa et al. | |

(Continued)

FOREIGN PATENT DOCUMENTS

CN        1503229        6/2004

(Continued)

OTHER PUBLICATIONS

Fukuzawa et al., U.S. Appl. No. 11/441,351, filed Oct. 13, 2009.

(Continued)

*Primary Examiner* — William J Klimowicz
(74) *Attorney, Agent, or Firm* — Nixon & Vanderhye, PC (57) ABSTRACT

A magneto-resistance effect element includes a first magnetic layer of which a magnetization direction is fixed; a second magnetic layer of which a magnetization direction is fixed; an intermediate layer which is provided between the first magnetic layer and the second magnetic layer; and a pair of electrodes for flowing a current perpendicular to a film surface of the resultant laminated body comprised of the first magnetic layer, the second magnetic layer and the intermediate layer. The intermediate layer includes insulating portions and metallic portions containing at least one selected from the group consisting of Fe, Co, Ni, Cr and the metallic portions are contacted with the first magnetic layer and the second magnetic layer.

8 Claims, 10 Drawing Sheets

U.S. PATENT DOCUMENTS

| | | | |
|---|---|---|---|
| 7,220,498 B2 | 5/2007 | Nagahama et al. | |
| 7,227,728 B2 | 6/2007 | Lin | |
| 7,307,819 B2 | 12/2007 | Fukuzawa et al. | |
| 7,483,291 B2 | 1/2009 | Saito et al. | |
| 7,495,870 B2 | 2/2009 | Yuasa et al. | |
| 7,504,898 B2 * | 3/2009 | Fukuzawa et al. | 331/96 |
| 7,515,387 B2 | 4/2009 | Yuasa et al. | |
| 7,525,772 B2 * | 4/2009 | Koui et al. | 360/324.1 |
| 7,602,592 B2 | 10/2009 | Fukuzawa et al. | |
| 2002/0048128 A1 | 4/2002 | Kamiguchi et al. | |
| 2002/0051380 A1 | 5/2002 | Kamiguchi et al. | |
| 2002/0191348 A1 | 12/2002 | Hasegawa et al. | |
| 2003/0063415 A1 | 4/2003 | Hasegawa et al. | |
| 2003/0104249 A1 | 6/2003 | Okuno et al. | |
| 2003/0184919 A1 | 10/2003 | Lin et al. | |
| 2004/0021990 A1 | 2/2004 | Koui et al. | |
| 2004/0042127 A1 * | 3/2004 | Hoshiya et al. | 360/322 |
| 2004/0100855 A1 | 5/2004 | Saito et al. | |
| 2004/0169963 A1 | 9/2004 | Okuno et al. | |
| 2004/0201929 A1 | 10/2004 | Hashimoto et al. | |
| 2004/0246631 A1 | 12/2004 | Dieny et al. | |
| 2005/0042478 A1 | 2/2005 | Okuno et al. | |
| 2005/0094327 A1 | 5/2005 | Okuno et al. | |
| 2005/0111145 A1 | 5/2005 | Yuasa et al. | |
| 2005/0136600 A1 * | 6/2005 | Huai | 438/296 |
| 2005/0168887 A1 | 8/2005 | Yuasa et al. | |
| 2005/0201020 A1 | 9/2005 | Fuke et al. | |
| 2005/0280957 A1 | 12/2005 | Gill | |
| 2006/0023372 A1 | 2/2006 | Fukuzawa et al. | |
| 2006/0034022 A1 | 2/2006 | Fukuzawa et al. | |
| 2006/0050444 A1 | 3/2006 | Fukuzawa et al. | |
| 2006/0056114 A1 | 3/2006 | Fukumoto et al. | |
| 2006/0077595 A1 | 4/2006 | Yuasa et al. | |
| 2006/0077596 A1 | 4/2006 | Yuasa et al. | |
| 2006/0098353 A1 | 5/2006 | Fukuzawa et al. | |
| 2006/0209472 A1 | 9/2006 | Koui et al. | |
| 2006/0268470 A1 | 11/2006 | Fukuzawa et al. | |
| 2007/0091511 A1 | 4/2007 | Hoshiya et al. | |
| 2008/0106825 A1 * | 5/2008 | Funayama et al. | 360/314 |
| 2009/0061105 A1 | 3/2009 | Fukuzawa et al. | |

FOREIGN PATENT DOCUMENTS

| | | | |
|---|---|---|---|
| CN | 1534605 | | 10/2004 |
| CN | 1604355 | | 4/2005 |
| GB | 2413856 A | * | 11/2005 |
| JP | 2003-204095 | | 7/2003 |
| JP | 2004153248 A | * | 5/2004 |
| JP | 2004-233641 | | 8/2004 |
| JP | 2004-257123 | | 9/2004 |
| JP | 2004-298774 | | 10/2004 |
| JP | 2004-325315 | | 11/2004 |
| JP | 2005-075140 | | 3/2005 |
| JP | 2005-285936 | | 10/2005 |
| JP | 2006-054257 | | 2/2006 |
| JP | 2006049426 A | * | 2/2006 |
| JP | 2006-073875 | | 3/2006 |
| JP | 2006-114610 | | 4/2006 |
| JP | 2006-135253 | | 5/2006 |
| JP | 2006-261306 | | 9/2006 |

OTHER PUBLICATIONS

Yuasa et al., U.S. Appl. No. 11/248,296, filed Apr. 7, 2009.

Fukuzawa et al., U.S. Appl. No. 11/190,886, filed Dec. 11, 2007.

* cited by examiner

MAGNETO-RESISTANCE EFFECT ELEMENT, MAGNETIC HEAD, MAGNETIC RECORDING/REPRODUCING DEVICE AND MAGNETIC MEMORY

CROSS-REFERENCE TO RELATED APPLICATIONS

This application is based upon and claims the benefit of priority from the prior Japanese Patent Application No. 2006-243868, filed on Sep. 8, 2006; the entire contents of which are incorporated herein by reference.

BACKGROUND OF THE INVENTION

1. Field of the Invention

The present invention relates to a magneto-resistance effect element which is configured such that a current is flowed in the direction perpendicular to the film surface thereof, a magnetic head, a magnetic recording/reproducing device and a magnetic memory which include the magneto-resistance effect element, respectively.

2. Description of the Related Art

The performance of a magnetic device is extremely developed which is originated from the discovery of a Giant Magnetoresitive Effect (GMR) in a laminated magnetic body. Particularly, since a spin valve film (SV film) is suitable for a magnetic device in structure, and can exhibit the GMR effect effectively and efficiently, the use of the SV film has developed the magnetic device such as a magnetic head and MRAM (Magnetic Random Access Memory).

The "spin valve" film has such a structure as sandwiching a non-magnetic metal spacer layer between two ferromagnetic layers and is configured such that the magnetization of one ferromagnetic layer (often called as a "pinning layer" or "fixed magnetization layer) is fixed by the magnetization of an anti-ferromagnetic layer and the magnetization of the other ferromagnetic layer (often called as a "free layer" or "free magnetization layer") is rotated in accordance with an external magnetic field (e.g., an medium magnetic field). With the spin valve film, the intended large magneto-resistance effect can be obtained when the relative angle between the pinning layer and the free layer is changed.

A conventional spin valve film is formed as a CIP (Current In Plane)-GMR element where a sense current is flowed parallel to the film surface of the spin valve film. Recently, a TMR (Tunneling MagnetoResistance) element or a CPP (Current Perpendicular to the Plane)-GMR element gathers attention because the TMR element or the CPP-GMR element can exhibit a larger MR effect than the CIP-GMR element. With the TMR element or the CPP-GMR element, a sense current is flowed perpendicular to the film surface of the TMR element or the CPP-GMR element.

With the TMR element, both of the MR effect and the resistance are large so that the S/N ratio may be deteriorated and the transfer rate of HDD may be lowered due to the large resistance. In this point of view, in order to apply the TMR element for an HDD with a surface recording density of 500 Gbpsi or over, it is required that the resistance of the TMR element is lowered under the condition that the MR effect of the TMR element is maintained large. With the CPP-GMR element, in contrast, both of the resistance and the resistance variation degree (MR effect) are extremely small so that the reproducing signal may be lowered due to the small MR effect which is in reverse to the case of the TMR element. Moreover, such a CPP-GMR element as having a spacer layer is proposed. The spacer layer is configured such that minute current paths (Current-confined Paths: CCPs) made of non magnetic metal are formed through an insulating layer. Since the CPP element can exhibit the CCP (Current-confined path) effect, the CPP can reproduce a larger output signal than the normal CPP-GMR element with the non-magnetic spacer layer. In view of the application for a magnetic head requiring high recording density, however, the CPP element can not exhibit a sufficient MR variation degree (MR effect).

In order to realize a larger MR variation degree (MR effect) applicable for high recording density, such a BMR (Ballistic MagnetoResistance) element as utilizing a BMR effect is proposed (refer to Reference No. 1).

[Reference No. 1] JP-A 2003-204095 (KOKAI)

The BMR effect can be recognized when the spacer connecting a pinning layer and a free layer in a conventional spin valve film is made of minute ferromagnetic metallic particles with their respective sizes in several atomic order. It is considered that the origin of the large MR effect relates to (1) the quantization of conductance at minute junctions or (2) the confinement of magnetic wall (magnetization rotating portion) at minute junctions, but can not be clarified at present. Also, various experiments are conducted, but such a formation technique as forming junctions minute enough to exhibit the BMR effect under good repeatability is not proposed so that the intended BMR element can not be formed sufficiently.

BRIEF SUMMARY OF THE INVENTION

It is an object of the present invention to provide a new type magneto-resistance effect element which can exhibit a large MR variation degree (MR effect) and is promising for the requirement of high recording density. Then, it is also an object of the present invention to provide a magnetic head, a magnetic recording/reproducing device and a magnetic random access memory which utilize the new type magneto-resistance effect element.

In order to achieve the above objects, an aspect of the present invention relates to a magneto-resistance effect element (first magneto-resistance effect element), including: a first magnetic layer of which a magnetization direction is fixed; a second magnetic layer of which a magnetization direction is fixed; an intermediate layer which is provided between the first magnetic layer and the second magnetic layer; and a pair of electrodes for flowing a current perpendicular to a film surface of the resultant laminated body comprised of the first magnetic layer, the second magnetic layer and the intermediate layer, wherein the intermediate layer includes insulating portions and metallic portions containing at least one selected from the group consisting of Fe, Co, Ni, Cr and the metallic portions are contacted with the first magnetic layer and the second magnetic layer.

Another aspect of the present invention relates to a magneto-resistance effect element (second magneto-resistance effect element), including: a first non-magnetic layer; a second non-magnetic layer; an intermediate layer which is provided between the first non-magnetic layer and the second non-magnetic layer; and a pair of electrodes for flowing a current perpendicular to a film surface of the resultant laminated body comprised of the first non-magnetic layer, the second non-magnetic layer and the intermediate layer, wherein the intermediate layer includes insulating portions and metallic portions containing at least one selected from the group consisting of Fe, Co, Ni, Cr and the metallic portions are contacted with the first non-magnetic layer and the second non-magnetic layer.

Still another aspect of the present invention relates to a magneto-resistance effect element (third magneto-resistance effect element), including: a magnetic layer of which a magnetization direction is fixed; a non-magnetic layer of which a magnetization direction is fixed; an intermediate layer which is provided between the magnetic layer and the non-magnetic layer; and a pair of electrodes for flowing a current perpendicular to a film surface of the resultant laminated body comprised of the magnetic layer, the non-magnetic layer and the intermediate layer, wherein the intermediate layer includes insulating portions and metallic portions containing at least one selected from the group consisting of Fe, Co, Ni, Cr and the metallic portions are contacted with the first non-magnetic layer and the second non-magnetic layer.

The inventors had intensely studied to achieve the above objects. As a result, the inventors found out the following facts of the matter. If a film is configured such that metallic portions with their respective predetermined sizes are arranged alternately via insulating portions with their respective predetermined sizes, respectively, magnetic portions with their respective randomly oriented magnetizations are formed in the metallic portions. In this case, when a magnetic field is applied to the film so that the direction of the magnetic field is parallel to the surface of the film, thereby aligning the magnetizations of the metallic portions of the film along the magnetic field, the film can exhibit a relatively large resistance variation, and thus, exhibit a relatively large MR effect.

Therefore, if the film is employed as an intermediate layer so that a magnetic layer (magnetic layers) and/or a non-magnetic layer (non-magnetic layers) can sandwich the intermediate layer and a pair of electrodes are formed on the outer surfaces of the magnetic layer (magnetic layers) and/or the non-magnetic layer (non-magnetic layers) so as to flow a current perpendicular to the film surface of the film, the resultant laminated body comprised of the intermediate layer, the magnetic layer (magnetic layers) and/or the non-magnetic layer (non-magnetic layers), and the electrodes can function as a CPP type magneto-resistance effect element.

In the magneto-resistance element, the metallic portions contain at least one selected from the group consisting of Fe, Co, Ni, Cr.

The insulating portions may be made of an oxide or a nitride containing at least one selected from the group consisting of Fe, Co, Ni, Cr, Al, Si, Mg. In this case, the MR effect occurred in the intermediate layer can be enhanced.

In the first and third magneto-resistance effect elements, both or either of the sandwiching layers for the intermediate layer is (are) made of magnetic layer(s). In this case, the magnetic layer(s) can function as (a) magnetic biasing layer(s) for the intermediate layer when an external magnetic field (magnetic signal) is applied parallel to the magnetization(s) of the magnetic layer(s), so that the intensity of the external magnetic field for developing an MR effect in the intermediate layer through the alignment of the magnetic orientation of the metallic portions can be reduced.

In an embodiment, an in-plane area of the metallic portions may be larger than an in-plane area of the insulating portions. In this case, the magnetic biasing from the magnetic layer(s) can be enhanced.

In another embodiment, a contacting area of the metallic portions with the first magnetic layer and the second magnetic layer may be set larger than an in-plane area of the metallic portions around the center in the thickness direction of the intermediate layer. In this case, the magnetic biasing effect of the magnetic layers can be averaged through the intermediate layer.

Therefore, if the new MR effect originated from the magneto-resistance effect element as described above is utilized, the magneto-resistance effect element can function as a magneto-resistance effect element with a larger MR variation ratio. In this point of view, the magneto-resistance effect element can satisfy the high density recording requirement. Then, if the magneto-resistance effect element is employed, the thus obtained magnetic head, magnetic recording/reproducing device and magnetic memory can satisfy the high density recording requirement.

According to the aspects of the present invention can be provided a new type magneto-resistance effect element which can exhibit a large MR variation degree (MR effect) and is promising for the requirement of high recording density, and provide a magnetic head, a magnetic recording/reproducing device and a magnetic random access memory which utilize the new type magneto-resistance effect element.

DETAILED DESCRIPTION OF THE INVENTION

Hereinafter, the present invention will be described in detail with reference to the drawings.

(Magneto-Resistance Effect Element)

Figure 1A:
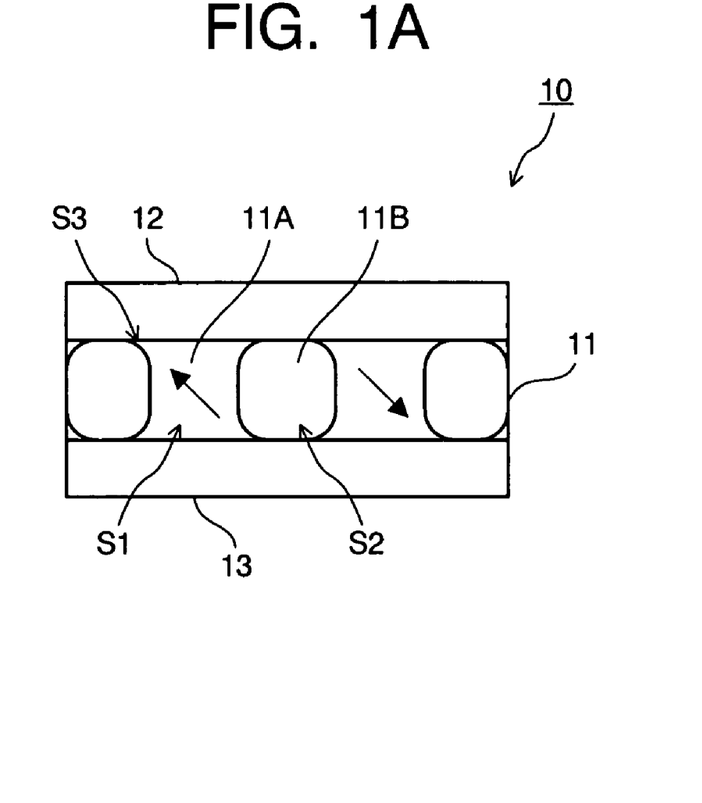
FIGS. 1A-1B are structural views illustrating an embodiment of the magneto-resistance effect element of the present invention.
Figure 1B:
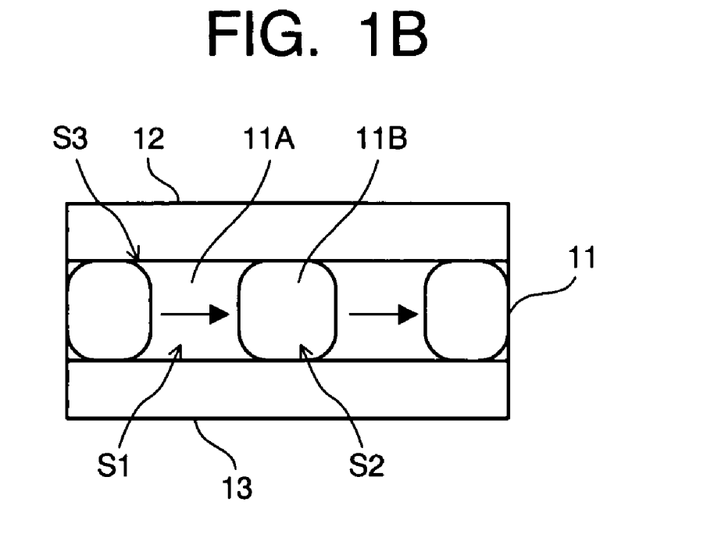

FIG. 1 is a structural view illustrating an embodiment of the magneto-resistance effect element of the present invention. In FIG. 1, some component are different more or less from the corresponding real components for clarifying the distinctive features of the magneto-resistance effect element.

The magneto-resistance effect element 10 includes an intermediate layer 11 with metallic portions 11A and insulating portions 11B, and a first non-magnetic layer 12 and a second non-magnetic layer 13 which are configured so as to sandwich the intermediate layer 11. The metallic portions 11A contain at least one selected from the group consisting of Fe, Co, Ni, Cr. The insulating portions 11B include an oxide or a nitride containing at least one selected from the group consisting of Fe, Co, Ni, Cr, Al, Si, Mg. A pair of electrodes (not shown) are provided on the outer surfaces of the first non-magnetic layer 12 and the second non-magnetic layer 13, respectively, so that a current is flowed perpendicular to the film surface of the resultant laminated body comprised of the intermediate layer 11, the non-magnetic layers 12, 13.

The intermediate layer 11 is configured such that the in-plane cross section S1 of the metallic portions 11A is larger than the in-plane cross section S2 of the insulating portions 11B.

Concretely, it is desired that the in-plane size (width) of the metallic portions 11A of the intermediate layer 11 is set to 50 nm or below, preferably to 30 nm or below, particularly to 20 nm or below. It is desired that the lower limited value of the in-plane size of the metallic portions 11A is set to one atomic order, preferably to 1 nm, particularly to 5 nm.

Concretely, it is desired that the in-plane size (thickness) of the insulating portions 11B of the intermediate layer 11 is set to 10 nm or below, preferably to 4 nm or below, particularly to 3 nm or below. It is desired that the lower limited value of the in-plane size of the metallic portions 11A is set to one atomic order, preferably to 0.5 nm, particularly to 2 nm.

If the in-plane sizes of the metallic portions 11A and the insulating portions 11B are set within the ranges as described above, respectively, the magneto-resistance effect element 10 can easily exhibit a larger MR effect originated from the corresponding larger resistance variation degree by aligning the magnetizations of the metallic portions 11A in the same direction as one another through the application of a magnetic field parallel to the film surface of the intermediate layer 11.

Moreover, in the intermediate layer 11, the contacting area S3 of the metallic portions 11A with the first non-magnetic layer 12 and the second non-magnetic layer 13 is set larger than the in-plane cross section S1 of the metallic portions 11A.

Since the metallic portions 11A of the intermediate layer 11 are contacted with the first non-magnetic layer 12 and the second non-magnetic layer 13, a current to applied perpendicular to the film surfaces of the first non-magnetic layer 12 and the second non-magnetic layer 13 is flowed through the metallic portions 11A of the intermediate layer 11.

Under no external magnetic field condition (no signal magnetic field from a magnetic recording medium), as shown in FIG. 1(a), the magnetizations of the metallic portions 11A of the intermediate layer 11 are twisted or inclined. Then, when an external magnetic field is applied parallel to the film surface of the intermediate layer 11, the twisted or inclined magnetizations of the metallic portions 11A are aligned in the same direction as the external magnetic field, as shown in FIG. 1(b). In this alignment, the electric resistance of the intermediate layer 11 is largely varied so that the corresponding large MR effect occurs in the intermediate layer 11.

FIG. 2 is a structural view illustrating another embodiment of the magneto-resistance effect element of the present invention. In FIG. 2, some component are different more or less from the corresponding real components for clarifying the distinctive features of the magneto-resistance effect element. Then, the same reference numerals are imparted to corresponding or like components through FIGS. 1 and 2. FIGS. 2(a) to (c) are cross sectional views illustrating the structure of the magneto-resistance effect element in this embodiment, and FIG. 2(d) is a plan enlarged view illustrating a film to exhibit an MR effect in the magneto-resistance effect element in this embodiment.

The magneto-resistance effect element 10 in FIG. 2 is formed as the one in FIG. 1 except that a first magnetic layer 22 and a second magnetic layer 23 are formed instead of the first non-magnetic layer 12 and the second non-magnetic layer 13. In this embodiment, the magnetization M1 is generated in the magnetic layers 22 and 23 so as to be parallel to the film surface of the intermediate layer 11. The magnetization M1 in the first magnetic layer 22 is the same as the magnetization M1 in the second magnetic layer 23 so that the intensity and the direction of the magnetization M1 in the first magnetic layer 22 is set equal to the ones in the second magnetic layer 23.

Figure 2A:
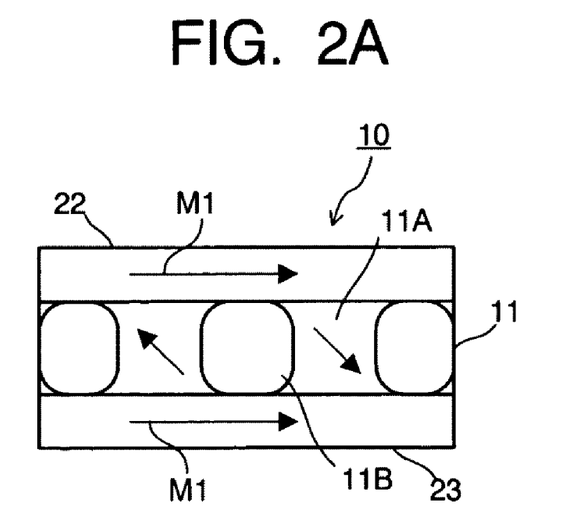
FIGS. 2A-2D are structural views illustrating another embodiment of the magneto-resistance effect element of the present invention.
Figure 2B:
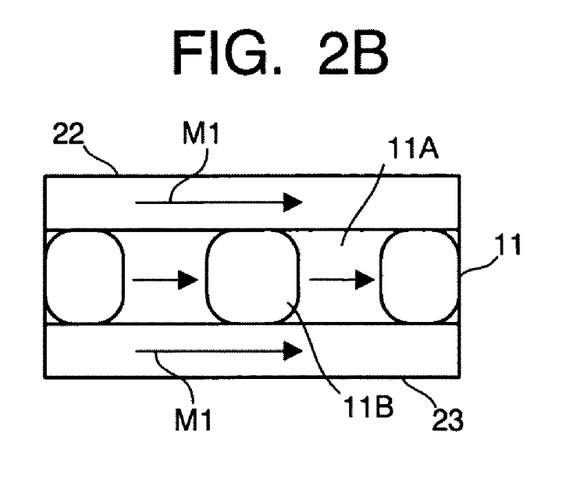
Figure 2C:
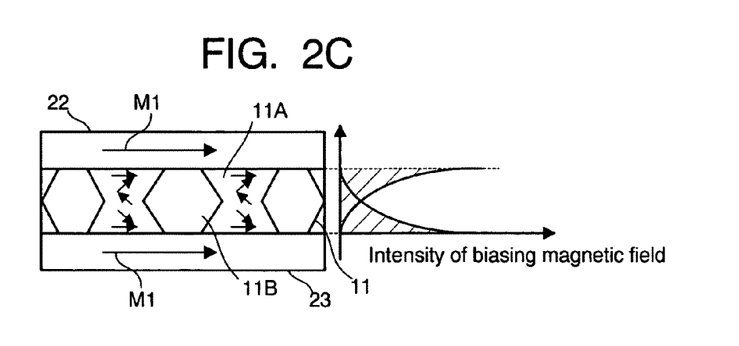

In this case, too, when an external magnetic field is applied parallel to the film surface of the intermediate layer 11, the twisted or inclined magnetizations of the metallic portions 11A are aligned in the same direction as the external magnetic field. In this alignment, the electric resistance of the intermediate layer 11 is largely varied so that the corresponding large MR effect occurs in the intermediate layer 11.

If the external magnetic field is applied in the same direction as the magnetization M1 of the first magnetic layer 22 and the second magnetic layer 23, the intensity of the external magnetic field to be required in the magnetization alignment as described above can be reduced. In this point of view, if the magnetization M1 of the first magnetic layer 22 and the second magnetic layer 23 is oriented in the same direction as the external magnetic field to be applied, the first magnetic layer 22 and the second magnetic layer 23 can function as magnetic biasing layers, respectively because the intensity of the external magnetic field can be reduced.

Figure 2D:
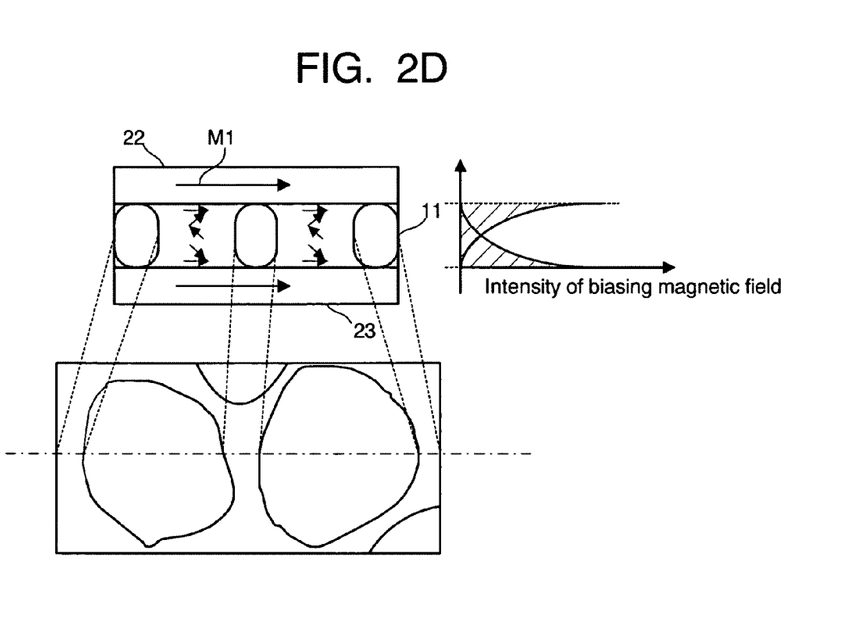

In the case that the first magnetic layer 22 and the second magnetic layer 23 are rendered the magnetic biasing layers, in order to make the best use of the magnetic biasing effect, it is desired to develop the contacting area of the metallic portions 11A with the magnetic layers 22 and 23. As shown in FIG. 2(d), concretely, the metallic portions 11A are enlarged in comparison with the insulating portions 11B so that the contacting areas of the metallic portions 11A with the magnetic layers 22 and 23 can be larger than the contacting area of the insulating portions 11B with the magnetic layers 22 and 23.

Moreover, the biasing effect of the magnetic layers 22 and 23 for the metallic portions 11A of the intermediate layer 11 is decreased toward the center area of the intermediate layer 11 from the contacting area of the intermediate layer 11 with the magnetic layers 22 and 23. In order to average the magnetic biasing effect of the magnetic layers 22 and 23 through the intermediate layer 11, the contacting area of the metallic portions 11A with the magnetic layers 22 and 23 are set larger than the in-plane area of the metallic portions 11A around the center in the thickness direction of the intermediate layer 11 (the in-plane area of the metallic portions 11A around the center in the thickness direction of the intermediate layer 11 is set smaller than the contacting area of the metallic portions 11A with the magnetic layers 22 and 23), as shown in FIG. 2(c).

In the embodiment relating to FIG. 2, although both of the non-magnetic layers 12 and 13 are substituted with the magnetic layers 22 and 23, respectively, either of the non-magnetic layers 12 and 13 may be substituted with the corresponding magnetic layer. In this case, however, since one magnetic layer is cancelled, the magnetic biasing function is lowered. Herein, if the remaining non-magnetic layer is made of normal electrode material, the total resistance of the magneto-resistance effect element 10 can be reduced so as to lower the sense current to detect the MR effect.

In the magneto-resistance effect element 10, the metallic portions 11A and the insulating portions 11B of the intermediate layer 11 can be formed as follows. First of all, a metallic layer containing at least one selected from the group consisting of Fe, Co, Ni, Cr is formed uniformly on the first non-magnetic layer 12 or the first magnetic layer 22. Then, the metallic layer is selectively oxidized by irradiating Ar ion beams onto the metallic layer while an oxygen gas is introduced. In this case, the insulating portions 11B can be formed as oxides in the metallic layer so that the metallic portions 11A can be formed as non-oxidized regions in the metallic layer. An RF plasma may be employed instead of the irradiation of the Ar ion beams.

If a nitrogen plasma or nitrogen ion beams are employed so as to selectively nitride the metallic layer, the insulating portions 11B can be formed as nitrides in the metallic layer so that the metallic portions 11A can be formed as non-nitrided regions in the metallic layer. The nitrogen plasma may be made directly of nitrogen gas, but indirectly of active nitrogen decomposed from ammonia gas.

(Magnetic Head and Magnetic Recording/Reproducing Device)

The magneto-resistance effect element is installed in advance in an all-in-one magnetic head assembly allowing both the recording/reproducing, and mounted as the head assembly at the magnetic recording/reproducing device.

Figure 3:
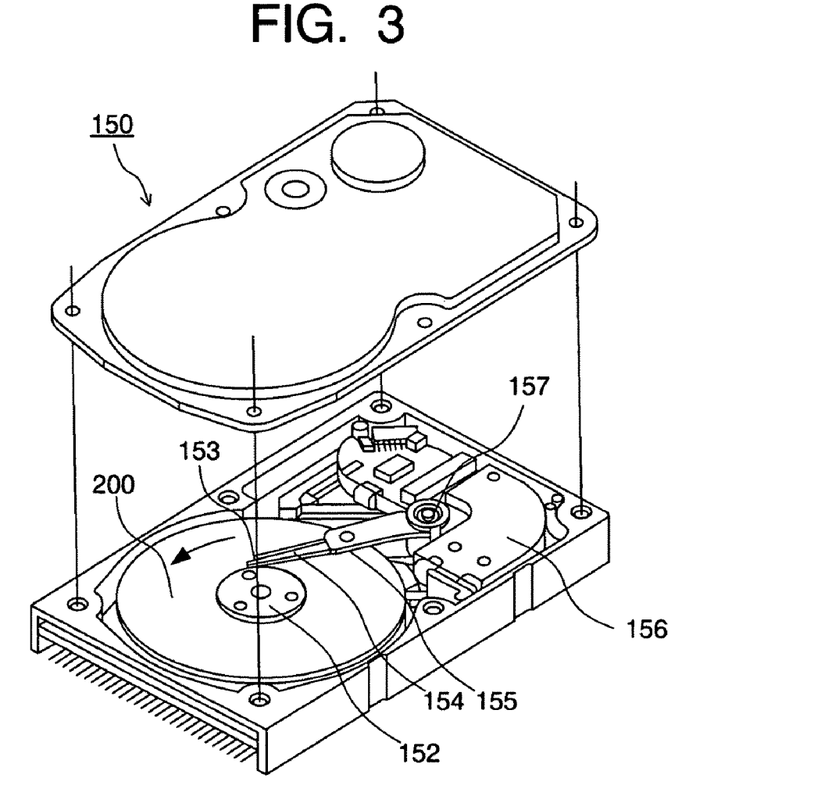
FIG. 3 is a perspective view illustrating an embodiment of the magnetic recording/reproducing device according to the present invention.

FIG. 3 is a perspective view illustrating the schematic structure of the magnetic recording/reproducing device. The magnetic recording/reproducing device 150 illustrated in FIG. 3 constitutes a rotary actuator type magnetic recording/reproducing device. In FIG. 3, a magnetic recording disk 200 is mounted to a spindle 152 to be turned in the direction designated by the arrow A by a motor (not shown) which is driven in response to control signals from a drive unit controller (not shown). In FIG. 3, the magnetic recording/reproducing apparatus 150 may be that provided with a single magnetic recording disk 200, but with a plurality of magnetic recording disks 200.

A head slider 153 recording/reproducing information to be stored in the magnetic recording disk 200 is mounted on a tip of a suspension 154 of a thin film type. The head slider 153 mounts at the tip the magnetic head containing the magnetic resistance effect element as described in above embodiments.

When the magnetic recording disk 200 is rotated, such a surface (ABS) of the head slider 153 as being opposite to the magnetic recording disk 200 is floated from on the main surface of the magnetic recording disk 200. Alternatively, the slider may constitute a so-called "contact running type" slider such that the slider is in contact with the magnetic recording disk 200. The suspension 154 is connected to one edge of the actuator arm 155 with a bobbin portion supporting a driving coil (not shown) and the like. A voice coil motor 156 being a kind of a linear motor is provided at the other edge of the actuator arm 155. The voice coil motor 156 is composed of the driving coil (not shown) wound around the bobbin portion of the actuator arm 155 and a magnetic circuit with a permanent magnet and a counter yoke which are disposed opposite to one another so as to sandwich the driving coil.

The actuator arm 155 is supported by ball bearings (not shown) provided at the upper portion and the lower portion of the spindle 157 so as to be rotated and slid freely by the voice coil motor 156.

Figure 4:
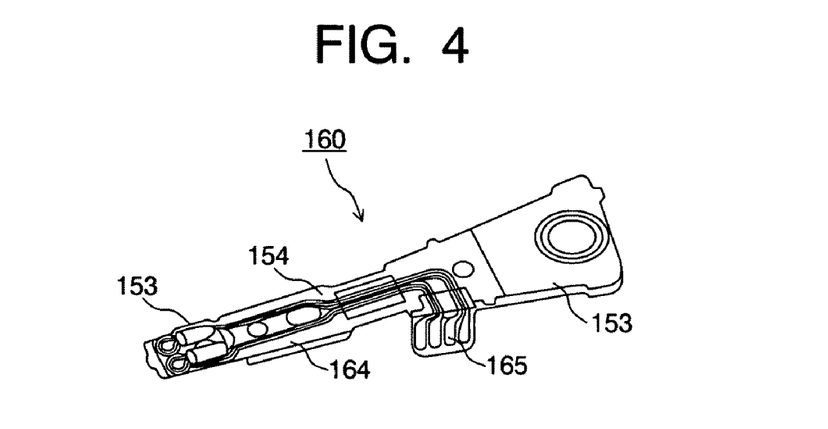
FIG. 4 is a perspective view illustrating an embodiment of the magnetic head assembly according to the present invention.

FIG. 4 is an enlarged perspective view illustrating a portion of the magnetic head assembly positioned at the tip side thereof from the actuator arm 155, as viewed from the side of the magnetic recording disk 200. As illustrated in FIG. 4, the magnetic head assembly 160 has the actuator arm 155 with the bobbin portion supporting the driving coil and the like. The suspension 154 is connected with the one edge of the actuator arm 155. Then, the head slider 153 with the magnetic head containing the magneto-resistance effect element as defined in above-embodiments is attached to the tip of the suspension 154. The suspension 154 includes a lead wire 164 for writing/reading signals, where the lead wire 164 is electrically connected with the respective electrodes of the magnetic head embedded in the head slider 153. In the drawing, reference numeral "165", denotes an electrode pad of the assembly 160.

In the magnetic recording/reproducing device illustrated in FIGS. 3 and 4, since the magneto-resistance effect element as described in the above embodiments is installed, the information magnetically recorded in the magnetic recording disk 200 can be read out properly.

(Magnetic Memory)

The magneto-resistance effect element as described above can constitute a magnetic memory such as a magnetic random access memory (MRAM) where memory cells are arranged in matrix.

Figure 5:
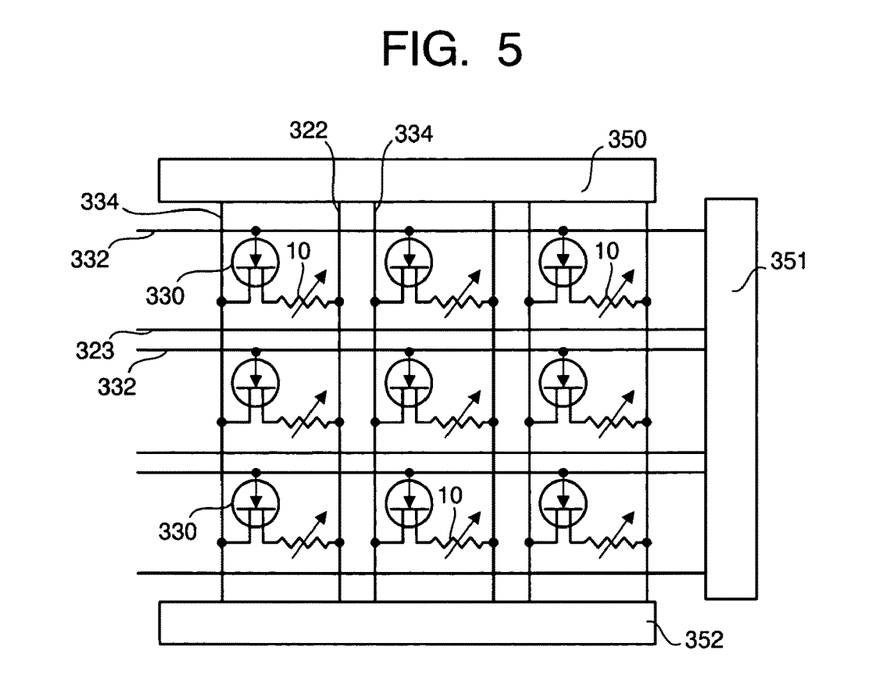
FIG. 5 is a view illustrating an embodiment of the magnetic memory matrix according to the present invention.

FIG. 5 is a view illustrating an embodiment of the magnetic memory matrix according to the present invention. This drawing shows a circuit configuration when the memory cells are arranged in an array. In order to select one bit in the array, a column decoder 350 and a line decoder 351 are provided, where a switching transistor 330 is turned ON by a bit line 334 and a word line 332 and to be selected uniquely, so that the bit information recorded in a magnetic recording layer (free layer) in the magneto-resistance effect film 10 can be read out by being detected by a sense amplifier 352. In order to write the bit information, a writing current is flowed in a specific write word line 323 and a bit line 322 to generate a magnetic field for writing.

Figure 6:
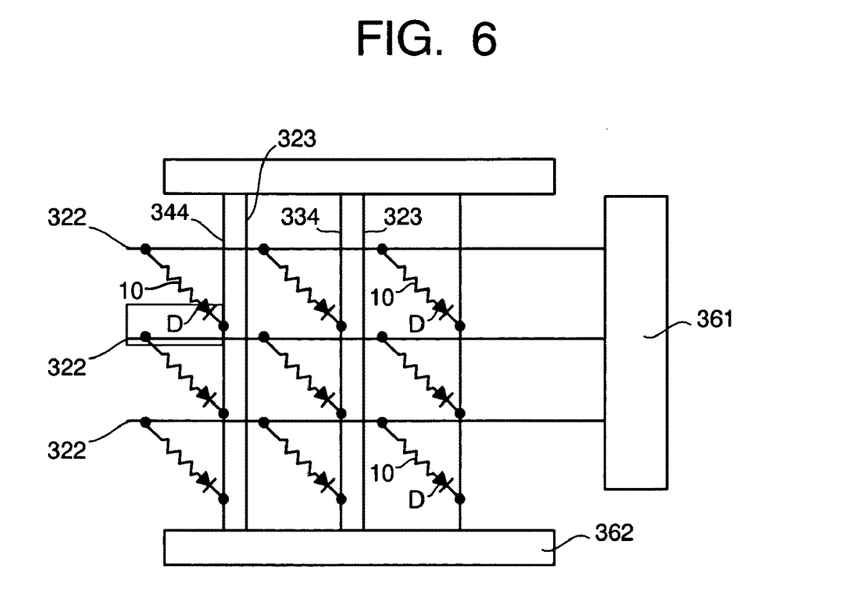
FIG. 6 is a view illustrating another embodiment of the magnetic memory matrix according to the present invention.

FIG. 6 is a view illustrating another embodiment of the magnetic memory matrix according to the present invention. In this case, a bit line 322 and a word line 334 which are arranged in matrix are selected by decoders 360, 361, respectively, so that a specific memory cell in the array is selected. Each memory cell is configured such that the magneto-resistance effect film 10 and a diode D is connected in series. Here, the diode D plays a role of preventing a sense current from detouring in the memory cell other than the selected magneto-resistance effect film 10. A writing is performed by a magnetic field generated by flowing the writing current in the specific bit line 322 and the word line 323, respectively.

Figure 7:
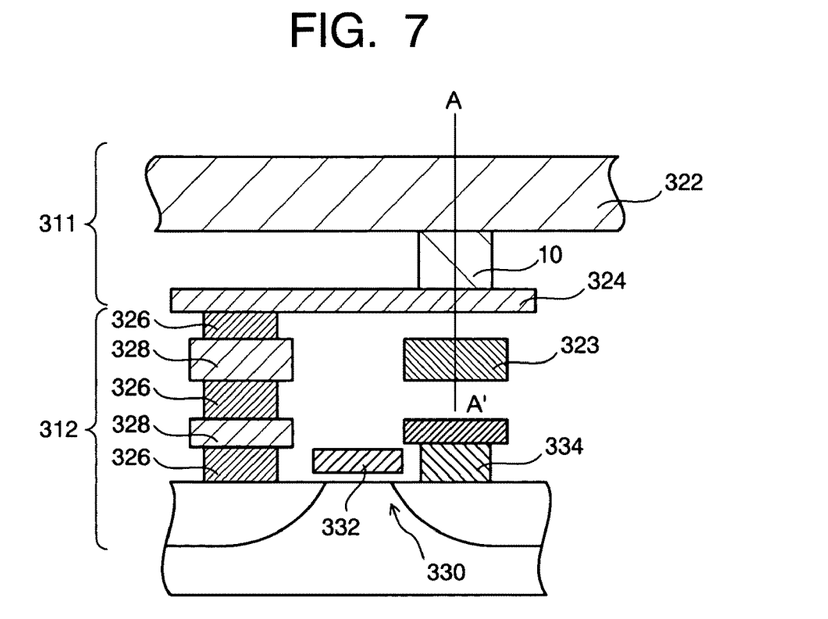
FIG. 7 is a cross sectional view illustrating a substantial portion of the magnetic memory in an embodiment according to the present invention.
Figure 8:
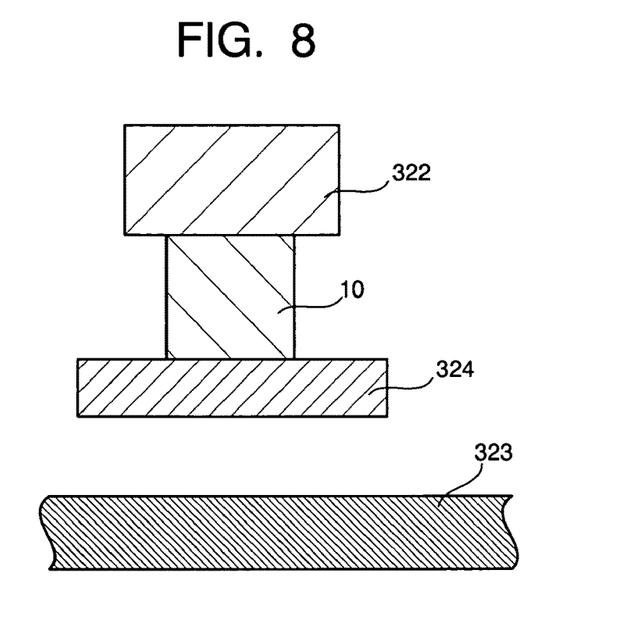
FIG. 8 is a cross sectional view of the magnetic memory illustrated in FIG. 7, taken on line "A-A'".

FIG. 7 is a cross sectional view illustrating a substantial portion of the magnetic memory in an embodiment according to the present invention. FIG. 8 is a cross sectional view of the magnetic memory illustrated in FIG. 7, taken on line "A-A'". The configuration shown in these drawings corresponds to a 1-bit memory cell included in the magnetic memory shown in FIG. 4 or FIG. 5. This memory cell includes a memory element part 311 and an address selection transistor part 312.

The memory element part 311 includes the magneto-resistance effect film 10 and a pair of wirings 322, 324 connected to the magneto-resistance effect film 10. The magneto-resistance effect film 10 is the magneto-resistance effect element (CCP-CPP element) as described in the above embodiments.

Meanwhile, in the address selection transistor part 312, a transistor 330 having connection therewith via a via 326 and an embedded wiring 328 is provided. The transistor 330 performs switching operations in accordance with voltages applied to a gate 332 to control the opening/closing of the current path between the magneto-resistance effect film 10 and the wiring 334.

Further, below the magneto-resistance effect film 10, a write wiring 323 is provided in the direction substantially orthogonal to the wiring 322. These write wirings 322, 323 can be formed of, for example, aluminum (Al), copper (Cu), tungsten (W), tantalnum (Ta) or an alloy containing any of these elements.

In the memory cell of such a configuration, when writing bit information into the magneto-resistance effect element 10, a writing pulse current is flowed in the wirings 322, 323, and a synthetic magnetic field induced by the writing current is applied to appropriately invert the magnetization of a recording layer of the magneto-resistance effect element 10.

Further, when reading out the bit information, a sense current is flowed through the magneto-resistance effect element 10 including the magnetic recording layer and a lower electrode 324 to measure a resistance value of or a fluctuation in the resistance values of the magneto-resistance effect element 10.

The magnetic memory according to the embodiment can assure writing and reading by surely controlling the magnetic domain of the recording layer even though the cell is miniaturized in size, with the use of the magneto-resistance effect element (CCP-CPP element) according to the above-described embodiment.

EXAMPLES

In order to verify the present invention, a magneto-resistance effect element of an embodiment was formed by means of photolithography. First of all, a bottom electrode was formed, and the films as listed below (stacking example 1) were subsequently formed on the bottom electrode. Then, the resultant laminated body was patterned to a size within a range of 0.5 to 3 μm square, and a top electrode was formed. The intermediate layer listed below corresponds to a magneto-resistance effect film of the magneto-resistance effect element, and the metallic portions and the insulating portions were formed in the intermediate layer by means of IAO technique listed in Table 1.

Stacking Example 1

| Underlayer: | Ta 5 nm/Ru 2 nm |
| Anti-ferromagnetic layer: | PtMn 15 nm |
| Ferromagnetic layer 3: | CoFe 3 nm |
| Anti-ferromagnetic coupling layer: | Ru 0.8 nm |
| Ferromagnetic layer 1: | CoFe 3 nm |
| Intermediate layer: | refer to Table 1 |
| Ferromagnetic layer 2: | CoFe 3 nm |
| Protective layer: | Cu 1 nm/Ta 2 nm/Ru 5 nm |

The laminated body was annealed during 10 hours at 270° C. under 10 kOe magnetic field so that the magnetization of the ferromagnetic layer 3 was able to be fixed by means of the uniaxial anisotropy of the anti-ferromagnetic layer (PtMn). The thickness of the anti-ferromagnetic coupling layer (Ru) was set to 0.8 nm so that the magnetizations of the (ferro) magnetic layers positioned above and below the coupling layer were able to be coupled with one another in anti-parallel. Herein, the "PtMn/ferromagnetic layer 3/Ru/ferromagnetic layer 11" constitutes a pinning layer called as a "synthetic pin structure".

| ID | Layer to be oxidized | oxygen exposing amount | oxidizing method |
|---|---|---|---|
| 1 | $Fe_{50}Co_{50}$ 1 nm | 2000 L | Ion beam oxidation (Ion Assisted Oxidation: IAO) |
| 2 | $Fe_{50}Co_{50}$ 1 nm | 3000 L | Ion beam oxidation (Ion Assisted Oxidation: IAO) |
| 3 | $Fe_{50}Co_{50}$ 1 nm | 4000 L | Ion beam oxidation (Ion Assisted Oxidation: IAO) |
| 4 | $Fe_{50}Co_{50}$ 1 nm | 5000 L | Ion beam oxidation (Ion Assisted Oxidation: IAO) |
| 5 | $Fe_{50}Co_{50}$ 1 nm | 6000 L | Ion beam oxidation (Ion Assisted Oxidation: IAO) |
| 6 | Fe 1 nm | 500 L | Ion beam oxidation (Ion Assisted Oxidation: IAO) |
| 7 | Fe 1 nm | 2000 L | Ion beam oxidation (Ion Assisted Oxidation: IAO) |
| 8 | Fe 0.5 nm | 1000 L | Ion beam oxidation (Ion Assisted Oxidation: IAO) |
| 9 | Fe 0.5 nm | 2000 L | Ion beam oxidation (Ion Assisted Oxidation: IAO) |
| 10 | Fe 0.5 nm | 3000 L | Ion beam oxidation (Ion Assisted Oxidation: IAO) |
| 11 | Fe 0.5 nm | 4000 L | Ion beam oxidation (Ion Assisted Oxidation: IAO) |

Figure 9:
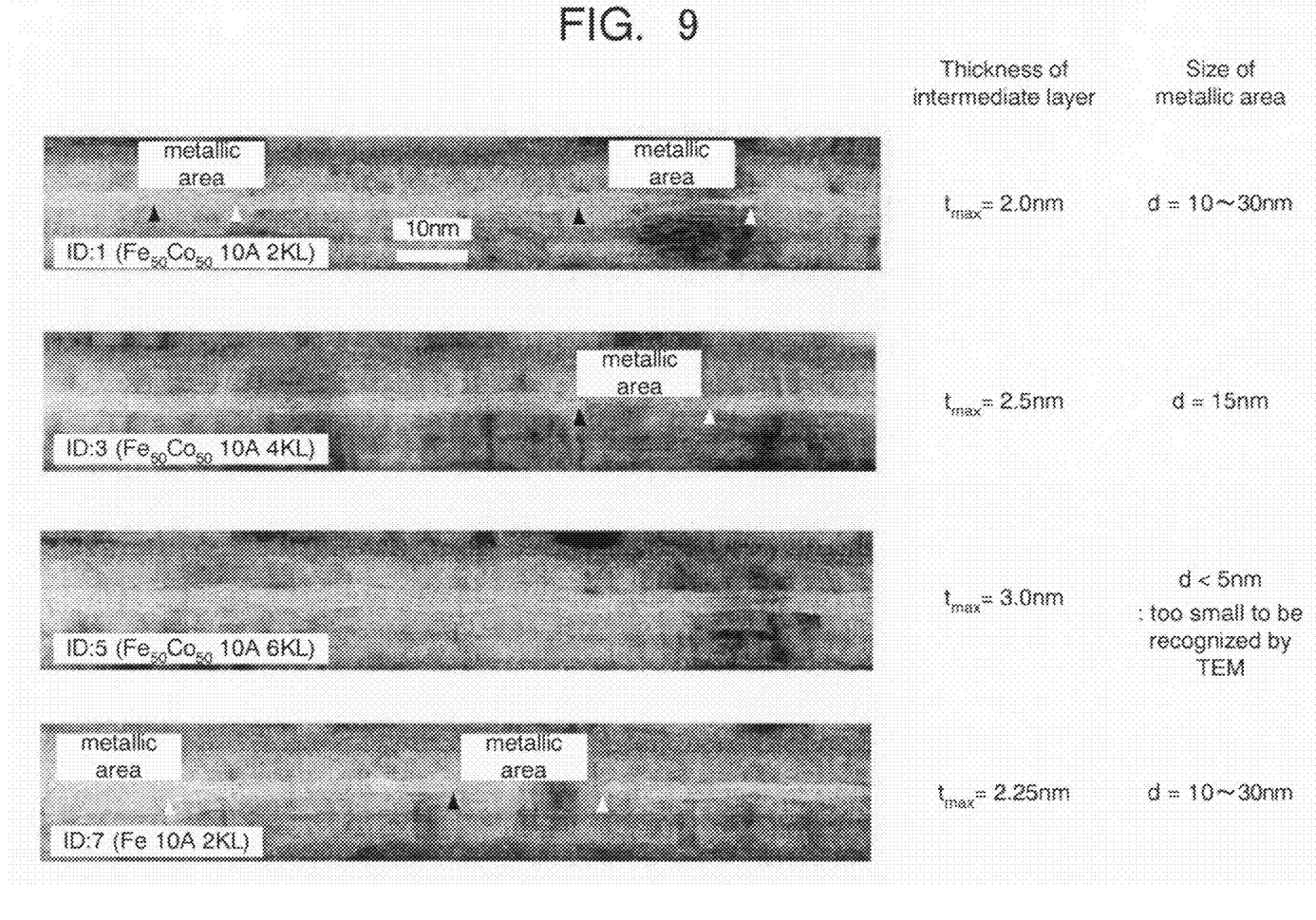
FIG. 9 shows cross sectional TEM images relating to Examples.

Then, the configuration of the laminated bodies formed in Examples will be described. FIG. 9 relates to cross sectional TEM image of the samples designated by ID1, ID3, ID5 and ID7. The thicknesses of the intermediate layers of the laminated bodies ID1, ID3, ID5 and ID7 are 2 nm, 2.5 nm, 2.25 nm and 3 nm, respectively. The thickness of each intermediate layer can be varied by controlling the oxidizing material and/or the oxidizing process. The size of the ferromagnetic metallic portion in the thickness direction is varied largely from 5 nm or less to around 30 nm. Since the size of the metallic portion is fluctuated to some degrees, it is considered that the ferromagnetic metallic portion with the above-described size as shown in FIG. 9 are formed entirely in the laminated bodies of the samples designated by ID1, ID3, ID5 and ID7.

Although the thickness of each intermediate layer can be varied within a range of one atomic layer to 10 nm, the thickness of each intermediate layer is preferably set within a range of 0.5 nm to 4 nm in view of electric resistance characteristics. Too thin intermediate layer results in decreasing the voltage resistance. Too thick intermediate layer results in elongating the ferromagnetic metallic portion in the direction perpendicular to the film surface so that the magnetization is unlikely to be aligned along the film surface which corresponds to the applying direction of the external magnetic field, originated from the shape anisotropy of the ferromagnetic metallic portion. Particularly, in view of the above-phenomenon due to the thickness of the intermediate layer, the thickness of the intermediate layer is preferably set within a range of 2 nm to 3 nm.

Although the size of the ferromagnetic metallic portion can be set within a range of one atomic layer to 50 nm along the film surface, the size of the ferromagnetic metallic portion is preferably set within a range of 1 nm to 30 nm in view of the electric resistance. In the case that the size of the ferromagnetic metallic portion is set to one atomic layer or less, the magnetization is unlikely to be rotated. In the case that the size of the ferromagnetic metallic portion is set to too large size, the ferromagnetic metallic portion may exhibit only the metallic properties. Particularly, in view of the above-phenomenon due to the size of the ferromagnetic metallic portion, the size of the ferromagnetic metallic portion is preferably set within a range of 5 nm to 20 nm.

In examination, a current was flowed along the stacking direction of the laminated body via the electrodes while an external magnetic field was swept and thus, the magneto-resistance variation of the laminated body (magneto-resistance effect element) was measured. The sweeping angle of the external magnetic field was set to zero degree when the direction of the external magnetic field was oriented toward the direction of the magnetization of the ferromagnetic layer 1 which was fixed by the anti-ferromagnetic layer (PtMn) and the anti-ferromagnetic coupling layer (Ru). The sweeping of the external magnetic field was carried out in anti clockwise rotation which was defined as positive direction.

Figure 10:
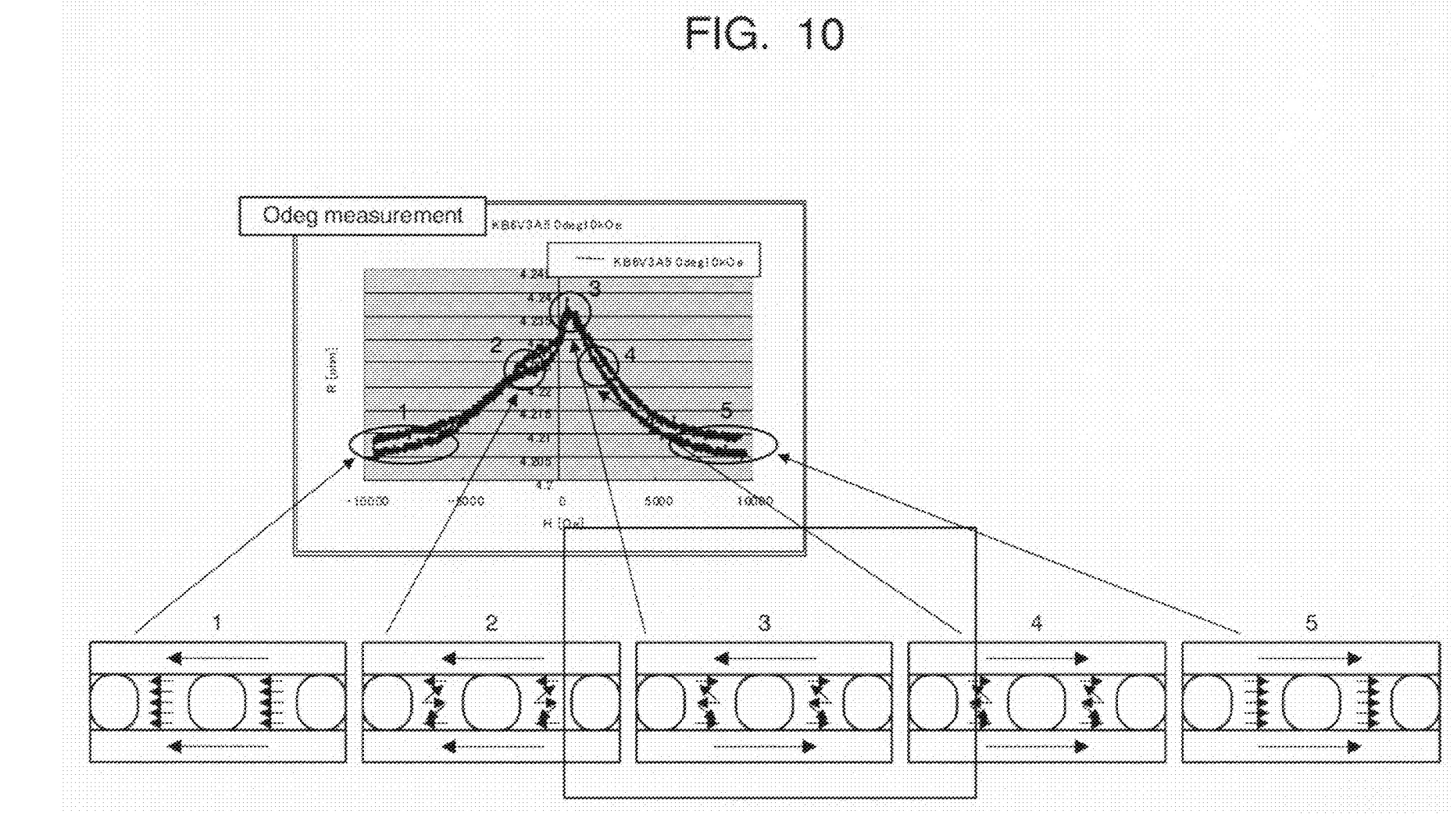
FIG. 10 is a graph showing an R-H curve in an embodiment of the magneto-resistance effect element according to the present invention.

First of all, ID: 3 was measured in electric resistance. FIG. 10 is a graph showing the R-H (the dependency of the electric resistance on the external magnetic field) curve in ID: 3. In FIG. 10, the sweeping of the external magnetic field was set to zero degree. It was confirmed that the electric resistance of ID: 3 was varied largely by the application of the external magnetic field of ±1 kOe so that ID: 3 exhibited the corresponding MR effect.

Then, the R-H curve becomes asymmetric for the external magnetic field within a lower magnetic range of ±1 kOe, which is originated from the variation in magnetization alignment between the ferromagnetic layer 1 and the ferromagnetic layer 2. The magnetization alignments anticipated from the corresponding portions of the R-H curve were drawn in FIG. 10. The reference numerals of the magnetization alignment drawings correspond to the reference numerals relating to the corresponding portions of the R-H curve.

The magnetization alignment drawings 2, 4 and 3 represent the variation in electric resistance in dependence on the relative magnetization alignment between the upper and lower ferromagnetic layers. The magnetization alignment drawing 3 shows the state where the magnetization of the upper ferromagnetic layer is anti-parallel to the magnetization of the lower ferromagnetic layer. The magnetization alignment drawings 2 and 4 show the state where the magnetization of the upper ferromagnetic layer is parallel to the magnetization of the lower ferromagnetic layer.

The resistance variation between the magnetization alignment drawings 2 and 4 corresponds to the resistance variation originated from the difference in magnetization alignment of the metallic portions of the intermediate layer. Then, the resistance variation between the magnetization alignment drawings 1 and 5 also corresponds to the resistance variation originated from the difference in magnetization alignment of the metallic portions of the intermediate layer. The resistance variation between the magnetization alignment drawings 2 and 4 corresponds to the resistance variation where the magnetizations of the metallic portions are twisted or fluctuated, and thus, not aligned. The resistance variation between the magnetization alignment drawings 1 and 5 corresponds to the resistance variation where the magnetizations of the metallic portions are aligned by the external magnetic field.

In this Example, it is apparent that the variation in electric resistance relating to the magnetic alignment drawings 2 and 4 or 1 and 5 is larger than the variation in electric resistance relating to the magnetic alignment drawings 2, 4 and 3. Accordingly, it is confirmed that the electric resistance of ID: 3 (laminated body, i.e., magneto-resistance effect element) can be varied largely due to the variation in magnetization alignment of the metallic portions of the intermediate layer so that ID: 3 can exhibit the corresponding MR effect though the sensitivity of the electric resistance should be improved for the external magnetic field.

Figure 11:
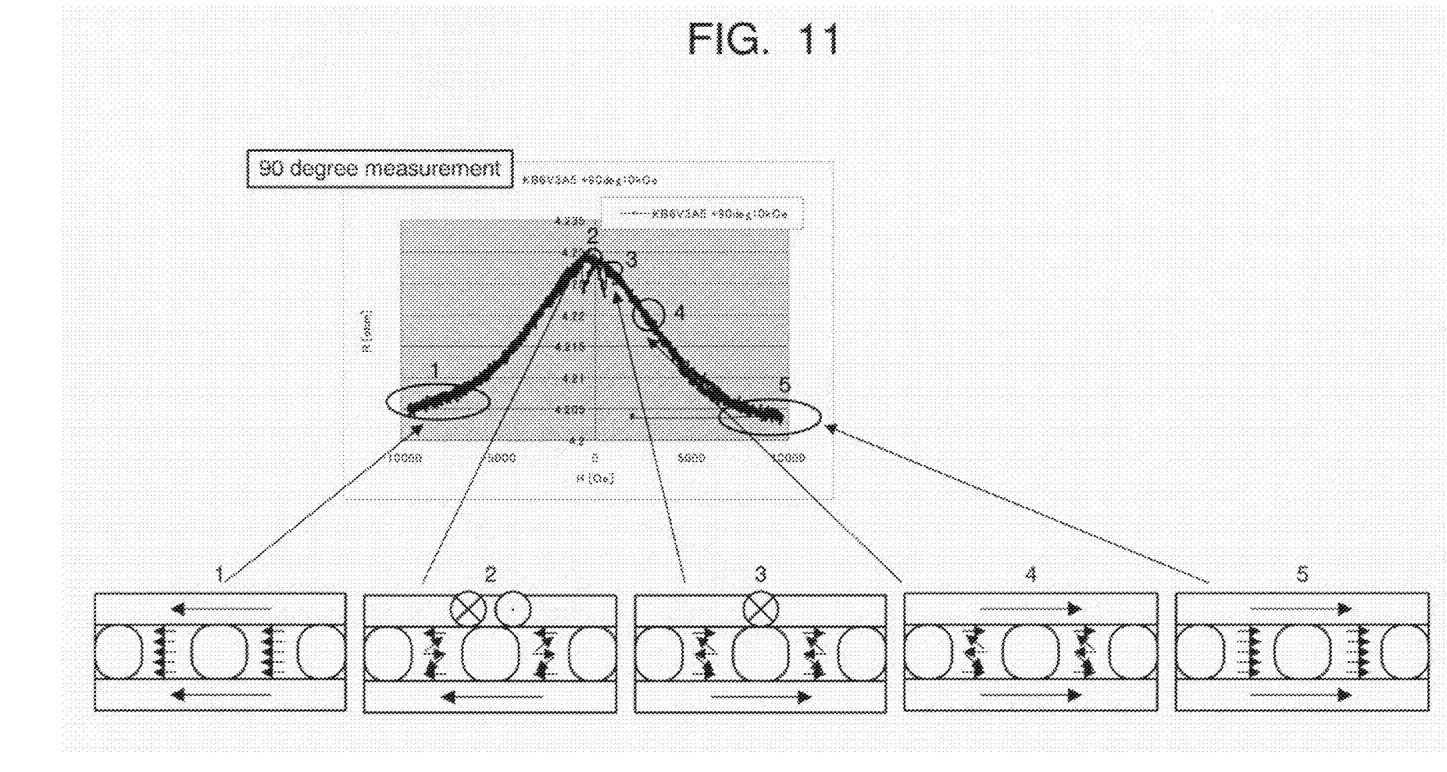
FIG. 11 is a graph showing another R-H curve in an embodiment of the magneto-resistance effect element according to the present invention.

FIG. 11 is another graph showing the R-H curve in ID: 3. In FIG. 11, the sweeping of the external magnetic field was set to 90 degrees. The magnetization alignment drawings 2, 4 and 3 represent the variation in electric resistance in dependence on the relative magnetization alignment between the upper and lower ferromagnetic layers. The magnetization alignment drawing 3 shows the state where the magnetization of the upper ferromagnetic layer is anti-parallel to the magnetization of the lower ferromagnetic layer. The magnetization alignment drawings 2 and 4 show the state where the magnetization of the upper ferromagnetic layer is parallel to the magnetization of the lower ferromagnetic layer.

The resistance variation between the magnetization alignment drawings 2 and 4 corresponds to the resistance variation originated from the difference in magnetization alignment of the metallic portions of the intermediate layer. Then, the resistance variation between the magnetization alignment drawings 1 and 5 also corresponds to the resistance variation originated from the difference in magnetization alignment of the metallic portions of the intermediate layer. The resistance variation between the magnetization alignment drawings 2 and 4 corresponds to the resistance variation where the magnetizations of the metallic portions are twisted or fluctuated, and thus, not aligned. The resistance variation between the magnetization alignment drawings 1 and 5 corresponds to the resistance variation where the magnetizations of the metallic portions are aligned by the external magnetic field.

In this Example, it is apparent that the variation in electric resistance relating to the magnetic alignment drawings 2 and 4 or 1 and 5 is larger than the variation in electric resistance relating to the magnetic alignment drawings 2, 4 and 3. Accordingly, it is confirmed that the electric resistance of ID: 3 (laminated body, i.e., magneto-resistance effect element) can be varied largely due to the variation in magnetization alignment of the metallic portions of the intermediate layer so that ID: 3 can exhibit the corresponding MR effect though the sensitivity of the electric resistance should be improved for the external magnetic field.

In this way, it is apparent from FIGS. 10 and 11 that in ID: 3 (laminated body, i.e., magneto-resistance effect element) where the magnetization of only the lower magnetic layer (ferromagnetic layer 1) is fixed, the resistance variation of ID: 3 as the external magnetic field is increased after the magnetization of the upper magnetic layer (ferromagnetic layer 2) is aligned to the magnetization of the lower magnetic layer is almost equal to the resistance variation of ID: 3 as the external magnetic field is increased after the magnetization of the upper magnetic layer is not aligned to the magnetization of the lower magnetic layer.

Then, the films were formed on the bottom electrode according to the stacking examples 2-4, instead of the stacking example 1. Then, the magneto-resistance variations of the laminated bodies (magneto-resistance effect elements) were measured as described above. In this Example, R-H curves (not shown) similar to FIGS. 10 and 11 were able to be obtained, and thus, it is confirmed that the laminated bodies can exhibit the corresponding MR effects. In the stacking example 2, the magnetizations of the ferromagnetic layers 1 and 2 were fixed in the same direction as one another. In the stacking example 3, the magnetization of the ferromagnetic layer was fixed directly by the corresponding anti-ferromagnetic layer, instead of the synthetic structure using Ru coupling layer. In the stacking example 4, the magnetization of the ferromagnetic layer was fixed by the corresponding hard magnetic layer Stacking Example 2

| | |
|---|---|
| Underlayer: | Ta 5 nm/Ru 2 nm |
| Anti-ferromagnetic layer: | PtMn 15 nm |
| Ferromagnetic layer 3: | CoFe 3 nm |
| Anti-ferromagnetic coupling layer: | Ru 0.8 nm |
| Ferromagnetic layer 1: | CoFe 3 nm |
| Intermediate layer: | refer to Table 1 |
| Ferromagnetic layer 2: | CoFe 3 nm |
| Anti-ferromagnetic coupling layer: | Ru 0.8 nm |
| Ferromagnetic layer 4: | CoFe 3 nm |
| Anti-ferromagnetic layer: | PtMn 15 nm |
| Protective layer: | Cu 1 nm/Ta 2 nm/Ru 5 nm |

Stacking Example 3

| | |
|---|---|
| Underlayer: | Ta 5 nm/Ru 2 nm |
| Anti-ferromagnetic layer: | PtMn, IrMn, FeMn |
| Ferromagnetic layer 1: | CoFe 3 nm |
| Intermediate layer: | refer to Table 1 |
| Ferromagnetic layer 2: | CoFe 3 nm |
| Protective layer: | Cu 1 nm/Ta 2 nm/Ru 5 nm |

Stacking Example 4

| | |
|---|---|
| Underlayer: | Ta 5 nm/Ru 2 nm |
| Anti-ferromagnetic layer: | CoPt |
| Ferromagnetic layer 1: | CoFe 3 nm |
| Intermediate layer: | refer to Table 1 |
| Ferromagnetic layer 2: | CoFe 3 nm |
| Protective layer: | Cu 1 nm/Ta 2 nm/Ru 5 nm |

Figure 12:
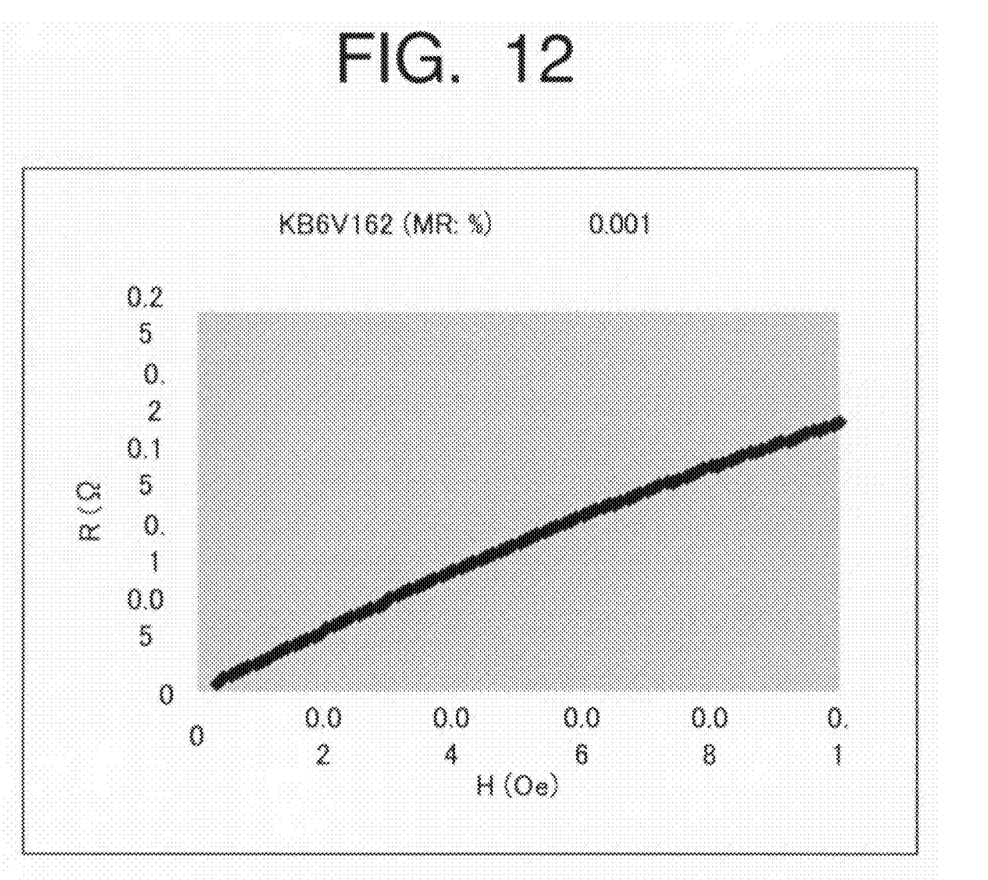
FIG. 12 is a graph showing an I-V characteristic curve in an embodiment of the magneto-resistance effect element according to the present invention.

In order to investigate the electric conduction (tunneling conduction or metallic conduction) in the laminated bodies including the corresponding intermediate layers (magneto-resistance effect films) as described above, the I-V characteristics relating to ID: 1, 2, 3, 4 and 5 in the stacking example 1 were measured. FIG. 12 is a graph showing a typical I-V characteristic curve relating to ID: 1, 2, 3, 4 and 5 in the stacking example 1. As is apparent from FIG. 12, the I-V characteristic becomes linear so that the electric conduction relating to ID: 1, 2, 3, 4 and 5 is ohmic conduction, i.e., metallic conduction, not tunneling conduction, which means that the electric conduction is carried out via the metallic portions of the intermediate layer contacting with the upper and lower ferromagnetic layers.

Although the present invention was described in detail with reference to the above examples, this invention is not limited to the above disclosure and every kind of variation and modification may be made without departing from the scope of the present invention.

When the magneto-resistance effect element is applied for a reproducing magnetic head, the detecting resolution of the magnetic head can be defined by applying magnetic shielding for the upper side and the lower side of the magneto-resistance effect element.

Moreover, the magneto-resistance effect element can be applied for both of a longitudinal magnetic recording type magnetic head and a vertical magnetic recording type magnetic recording type magnetic head. Also, the magneto-resistance effect element can be applied for both of a longitudinal magnetic recording/reproducing device and a vertical magnetic recording/reproducing device.

The magnetic recording/reproducing device may be a so-called stationary type magnetic device where a specific recording medium is installed therein or a so-called removable type magnetic device where a recording medium can be replaced.

What is claimed is:

1. A magneto-resistance effect element, comprising:
   a first magnetic layer of which a magnetization direction is fixed;
   a second magnetic layer of which a magnetization direction is fixed;
   an intermediate layer which is provided between said first magnetic layer and said second magnetic layer; and
   a pair of electrodes for flowing a current perpendicular to a film surface of the resultant laminated body comprised of said first magnetic layer, said second magnetic layer and said intermediate layer,
   wherein said intermediate layer includes insulating portions and metallic portions containing at least one selected from the group consisting of Fe, Co, Ni, Cr and said metallic portions are contacted with said first magnetic layer and said second magnetic layer.

2. The magneto-resistance effect element as set forth in claim 1,
   wherein said insulating portions are made of an oxide or a nitride containing at least one selected from the group consisting of Fe, Co, Ni, Cr, Al, Si, Mg.

3. The magneto-resistance effect element as set forth in claim 1,
   wherein an in-plane area of said metallic portions are larger than an in-plane area of said insulating portions.

4. The magneto-resistance effect element as set forth in claim 1,
   wherein a contacting area of said metallic portions with said first magnetic layer and said second magnetic layer are set larger than an in-plane area of said metallic portions around the center in the thickness direction of said intermediate layer.

5. The magneto-resistance effect element as set forth in claim 1,
   wherein an in-plane size (width) of said metallic portions of said intermediate layer is set to 50 nm or below.

6. A magnetic head, comprising a magneto-resistance effect element as set forth in claim 1.

7. A magnetic recording/reproducing device, comprising a magnetic head as set forth in claim 6 and a magnetic recording medium.

8. A magnetic memory, comprising a magneto-resistance effect element as set forth in claim 1.

* * * * *